(12) United States Patent
Co et al.

(10) Patent No.: US 7,197,676 B2
(45) Date of Patent: Mar. 27, 2007

(54) LOOP-BACK MEMORY-MODULE EXTENDER CARD FOR SELF-TESTING FULLY-BUFFERED MEMORY MODULES

(75) Inventors: Ramon S. Co, Trabuco Canyon, CA (US); Tat Leung Lai, Torrance, CA (US)

(73) Assignee: Kingston Technology Corp., Fountain Valley, CA (US)

( * ) Notice: Subject to any disclaimer, the term of this patent is extended or adjusted under 35 U.S.C. 154(b) by 190 days.

(21) Appl. No.: 10/908,716

(22) Filed: May 24, 2005

(65) Prior Publication Data

US 2006/0282722 A1    Dec. 14, 2006

(51) Int. Cl.
*G11C 29/00*  (2006.01)
*G06F 11/00*  (2006.01)

(52) U.S. Cl. .......................................... 714/718; 714/42
(58) Field of Classification Search ................ 714/25, 714/42, 718; 324/754, 763
See application file for complete search history.

(56) References Cited

U.S. PATENT DOCUMENTS

| | | | |
|---|---|---|---|
| 5,524,232 A | 6/1996 | Hajeer | 711/115 |
| 6,317,352 B1 | 11/2001 | Halbert et al. | 365/52 |
| 6,493,250 B2 | 12/2002 | Halbert et al. | 365/63 |
| 7,117,405 B2* | 10/2006 | Co et al. | 714/718 |
| 2004/0105292 A1 | 6/2004 | Matsui | 365/63 |
| 2004/0216011 A1* | 10/2004 | Co et al. | 714/42 |
| 2004/0256638 A1 | 12/2004 | Perego et al. | 257/200 |
| 2005/0010737 A1 | 1/2005 | Ware et al. | 711/167 |
| 2005/0080581 A1* | 4/2005 | Zimmerman et al. | 702/117 |
| 2005/0098881 A1* | 5/2005 | Perner | 257/724 |
| 2005/0246594 A1* | 11/2005 | Co et al. | 714/52 |
| 2006/0282722 A1* | 12/2006 | Co et al. | 714/724 |

FOREIGN PATENT DOCUMENTS

| | | |
|---|---|---|
| DE | 10042620 A1 * | 3/2002 |
| DE | 010345980 A1 * | 10/2003 |

OTHER PUBLICATIONS

"Embedded Test for a New Memory-Card Architecture" by Resnick Test Conference, 2004. Proceedings. ITC 2004. International Publication Date: Oct. 26-28, 2004 On pp. 875-882 ISBN: 0-7803-8580-2 INSPEC Accession No. 8291777.*
DDR2 SDRAM FBDIMM MT9HTF3272F, MT9HTF12872F data sheet, Rev A Micron Technology, Apr. 2005, pp. 1-36.
US 6,832,284, 12/2004, Perego et al. (withdrawn)

* cited by examiner

*Primary Examiner*—Cynthia Britt
(74) *Attorney, Agent, or Firm*—g Patent LLC; Stuart T. Auvinen

(57) ABSTRACT

A loop-back extender card is plugged into a memory module socket on a personal computer (PC) motherboard. The extender card has a test socket that receives a memory module under test. An Advanced Memory Buffer (AMB) on the memory module fully buffers DRAM chips on the memory module. The AMB inputs from and outputs to the test socket differential northbound lanes (toward a processor) and southbound lanes (away from the processor). The extender card has northbound loopback traces that connect northbound lane outputs from the memory module back to northbound-lane inputs to the memory module. Southbound loopback traces connect southbound lane outputs from the memory module back to southbound-lane inputs to the memory module. The loop-back extender card allows the AMB to perform loopback testing without modifying the PC motherboard. Series/shunt resistors can be placed on the loopback traces, or serpentine traces can be used to increase loopback delays.

20 Claims, 7 Drawing Sheets

FRONT SIDE

EXTERNAL DATA LOOP-BACK

FIG. 5A  PRIOR ART
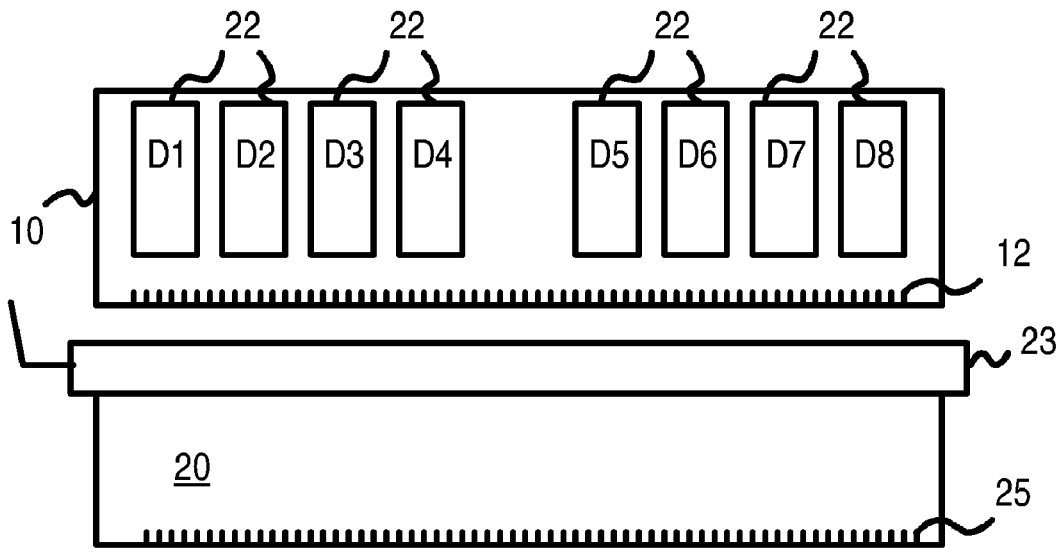
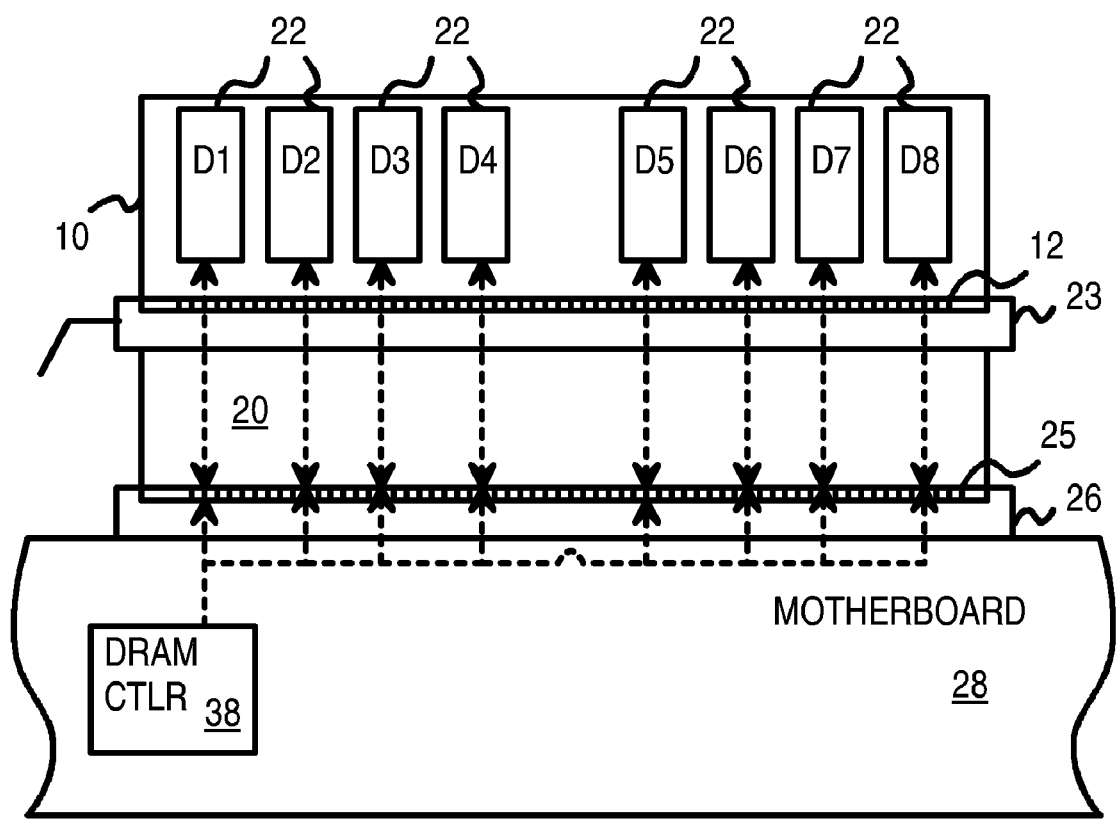
FIG. 5B  PRIOR ART

LOOP-BACK MEMORY-MODULE EXTENDER CARD FOR SELF-TESTING FULLY-BUFFERED MEMORY MODULES

FIELD OF THE INVENTION

This invention relates to memory modules, and more particularly to extender cards for testing memory modules.

BACKGROUND OF THE INVENTION

Electronic systems such as personal computers (PC's) often use small printed-circuit board (PCB) daughter cards known as memory modules instead of directly mounting individual memory chips on a motherboard. The memory modules are built to meet specifications set by industry standards, thus ensuring a wide potential market. High-volume production and competition have driven module costs down dramatically, benefiting the PC buyer.

Memory modules are made in many different sizes and capacities, such as older 30-pin and 72-pin single-inline memory modules (SIMMs) and newer 168-pin, 184-pin, and 240-pin dual inline memory modules (DIMMs). The "pins" were originally pins extending from the module's edge, but now most modules are leadless, having metal contact pads or leads. The modules are small in size, being about 3–5 inches long and about an inch to an inch and a half in height.

The modules contain a small printed-circuit board substrate, typically a multi-layer board with alternating laminated layers of fiberglass insulation and foil or metal interconnect layers. Surface mounted components such as DRAM chips and capacitors are soldered onto one or both surfaces of the substrate.

FIG. 1 shows a fully-buffered memory module. Memory module 10 contains a substrate such as a multi-layer printed-circuit board (PCB) with surface-mounted DRAM chips 22 mounted to the front surface or side of the substrate, as shown in FIG. 1, while more DRAM chips 22 are mounted to the back side or surface of the substrate (not shown). Memory module 10 is a fully-buffered dual-inline memory module (FB-DIMM) that is fully buffered by Advanced Memory Buffer (AMB) 24 on memory module 10.

Metal contact pads 12 are positioned along the bottom edge of the module on both front and back surfaces. Metal contact pads 12 mate with pads on a module socket to electrically connect the module to a PC's motherboard. Holes 16 are present on some kinds of modules to ensure that the module is correctly positioned in the socket. Notches 14 also ensure correct insertion of the module. Capacitors or other discrete components are surface-mounted on the substrate to filter noise from the DRAM chips 22.

As system clock speeds increase, data must be transmitted and received at ever-increasing rates. Differential signaling techniques are being used to carry data, clock, and commands to and from memory modules. AMB 24 is a chip mounted onto the substrate of memory module 10 to support differential signaling through metal contact pads 12. AMB 24 sends and receives external packets or frames of data and commands to other memory modules in other sockets over differential data lines in metal contact pads 12.

AMB 24 also extracts data from the external frames and writes the extracted data to DRAM chips 22 on memory module 10. Command frames to read data are decoded by AMB 24. AMB 24 sends addresses and read signals to DRAM chips 22 to read the requested data, and packages the data into external frames that are transmitted from AMB 24 over metal contact pads 12 to other memory modules and eventually to the host processor.

Memory module 10 is known as a fully-buffered memory module since AMB 24 buffers data from DRAM chips 22 to metal contact pads 12. DRAM chips 22 do not send and receive data directly from metal contact pads 12 as in many prior memory module standards. Since DRAM chips 22 do not directly communicate data with metal contact pads 12, signals on metal contact pads 12 can operate at very high data rates.

FIG. 2 shows detail of an advanced memory buffer on a fully-buffered memory module. AMB 24 contains DRAM controller 50, which generates DRAM control signals to read and write data to and from DRAM chips 22 on memory module 10. Data is temporarily stored in FIFO 58 during transfers.

The data from FIFO 58 is encapsulated in frames that are sent over differential lines in metal contact pads 12. Rather than being sent directly to the host central processing unit (CPU), the frames are passed from one memory module to the next memory module until the frame reaches the host CPU. Differential data lines in the direction toward the host CPU are known as northbound lanes, while differential data lines from the CPU toward the memory modules are known as southbound lanes.

When a frame is sent from the host CPU toward a memory module, the frame is sent over the southbound lanes toward one of the memory modules in the daisy chain. Each memory module passes the frame along to the next memory module in the daisy chain. Southbound lanes that are input to a memory module are buffered by its AMB 24 using re-timing and re-synchronizing buffers 54. Re-timing and re-synchronizing buffers 54 restore the timing of the differential signals prior to retransmission. Input buffers 52 and output buffers 56 contain differential receivers and transmitters for the southbound lanes that are buffered by re-timing and re-synchronizing buffers 54.

Frames that are destined for the current memory module are copied into FIFO 58 and processed by AMB 24. For example, for a write frame, the data from FIFO 58 is written to DRAM chips 22 on the memory module by AMB 24. For a read, the data read from DRAM chips 22 is stored in FIFO 58. AMB 24 forms a frame and sends the frame to northbound re-timing and re-synchronizing buffers 64 and out over the northbound lanes from differential output buffer 62. Input buffers 66 and output buffers 64 contain differential receivers and transmitters for the northbound lanes that are buffered by re-timing and re-synchronizing buffers 64.

Self-testing of the memory module is supported by built-in self-test (BIST) controller 60. BIST controller 60 may support a variety of self-test features such as a mode to test DRAM chips 22 on the module and a loop-back test mode to test connections through metal contact pads 12 on memory module 10.

FIG. 3 shows fully-buffered memory modules daisy chained together. Host CPU 210 on motherboard 28 reads and writes main memory in DRAM chips 22 on memory modules 201–204 through memory controller 220 on motherboard 28. Memory modules 201–204 are inserted into memory module sockets on motherboard 28.

Rather than read and write DRAM chips 22 directly, host CPU 210 sends read and write commands in packets or frames that are sent over southbound lanes 102. The frame from host CPU 210 is first sent from memory controller 220 to first memory module 201 in the first socket. AMB 24 on first memory module 201 examines the frame to see if it is intended for first memory module 201 and re-buffers and passes the frame on to second memory module 202 over another segment of southbound lanes 102. AMB 24 on second memory module 202 examines the frame and passes the frame on to third memory module 203. AMB 24 on third memory module 203 examines the frame and passes the frame on to fourth memory module 204.

When data is read, or a reply frame is sent back to host CPU 210, northbound lanes 104 are used. For example, when DRAM chips 22 on third memory module 203 are read, the read data is packaged in a frame by AMB 24 and sent over northbound lanes 104 to second memory module 202, which re-buffers the frame and sends it over another segment of northbound lanes 104 to first memory module 201. First memory module 201 then re-buffers the frame of data and sends it over northbound lanes 104 to memory controller 220 and on to host CPU 210.

Since northbound lanes 104 and southbound lanes 102 are composed of many point-to-point links between adjacent memory modules, the length and loading of these segments is reduced, allowing for higher speed signaling. Signaling is to AMB 24 on each memory module rather than to DRAM chips 22.

FIG. 4 shows external loop-back testing of a fully-buffered memory module. BIST controller 60 supports a test mode that activates pattern generator 61 to generate a sequence of test vectors that are written to FIFO 58. The test vectors are then buffered by re-timing and re-synchronizing buffers 54 and transmitted by output buffers 56 over the southbound lanes.

During the loop-back test mode, the output southbound lanes are connected to the input southbound lanes by external loopback wires 68. The test vectors are then input from external loopback wires 68 by input buffers 52, and are written into FIFO 58 by re-timing and re-synchronizing buffers 54. Comparator 63 in BIST controller 60 then compares the test vectors received through input buffers 52 with the test vectors generated by pattern generator 61. These test vectors should match. A failure is signaled when the text vectors do not match. A mismatch could occur when external loopback wires 68 have a break in them.

Similar loopback testing of the northbound lanes may also be performed. The test vectors do not have to be stored in FIFO 58, but could be immediately transmitted and checked.

External loopback wires 68 may be emulated by automated-test-equipment (ATE) that is testing memory modules. Some motherboards may include external loopback wires 68, but this may require muxes or switches on the motherboard that increase loading on the northbound and southbound lanes.

FIGS. 5A–B show testing a memory module using an extender card. Memory module 10 has DRAM chips 22 mounted thereon. Metal contact pads 12 on the lower edge of memory module 10 are for inserting into test socket 23 on extender card 20. Metal wiring traces on extender card 20 connect signals from test socket 23 to the corresponding signals on lower-edge contact pads 25 so that all signals are passed through unchanged, as shown in FIG. 5B.

The direct pass-through of signals from lower-edge contact pads 25 to test socket 23 and contact pads 12 allows memory module 10 to be tested just as if memory module 10 were inserted directly into memory module socket 26 on PC motherboard 28. The increased height of test socket 23 above the surface of PC motherboard 28 makes testing easier since test socket 23 is more easily reached by an operator or handler machine.

During testing of memory module 10 inserted into test socket 23, DRAM controller 38 on PC motherboard 28 receives data from a CPU or bus master and generates control signals to DRAM chips 22 on memory module 10 to write the data. A variety of specialized data patterns may be written to DRAM chips 22 and read back. These specialized data patterns have been developed to detect certain types of errors that can occur in DRAM chips, such as a single memory cell that is stuck high or low, or shorts between adjacent cells. Patterns such as walking-ones, walking-zeros, checkerboard, and inverse checkerboards are often used.

While fully-buffered memory modules are useful for high-speed systems, the loopback testing mode may require adding switches or muxes to the motherboard. For example, northbound lane outputs from one memory module socket are normally routed to another memory module socket, but for loop-back test mode these northbound lane outputs must be routed back to the northbound lane inputs to the same memory module. Adding switches or muxes increases the cost of the motherboard, and may make PCB trace routing more challenging. Any increase in trace lengths increases loading and delay of the northbound or southbound lanes and is undesirable. Inputs to the switches or muxes also increases lane loading.

What is desired is to perform loop-back testing of fully-buffered memory modules on a motherboard. It is also desired to perform loop-back testing on a motherboard without switches and muxes for supporting loop-back testing.

BRIEF DESCRIPTION OF THE DRAWINGS

FIGS. 5A–B show testing a memory module using an extender card.

DETAILED DESCRIPTION

The present invention relates to an improvement in testing of memory modules. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have discovered that extender cards may be used to support loop-back testing of fully-buffered memory modules. The motherboard does not have to directly support loop-back testing. Muxes and switches for loop-back testing of memory modules do not have to be placed on the motherboard, allowing motherboard traces for northbound and southbound lanes to be as small as possible. Thus high-speed operation of the memory modules is enhanced.

Figure 1:
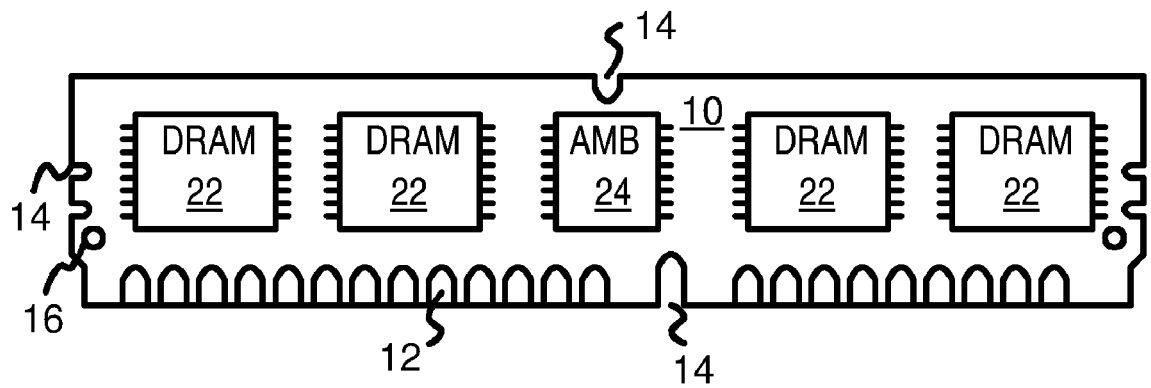
FIG. 1 shows a fully-buffered memory module.
Figure 2:
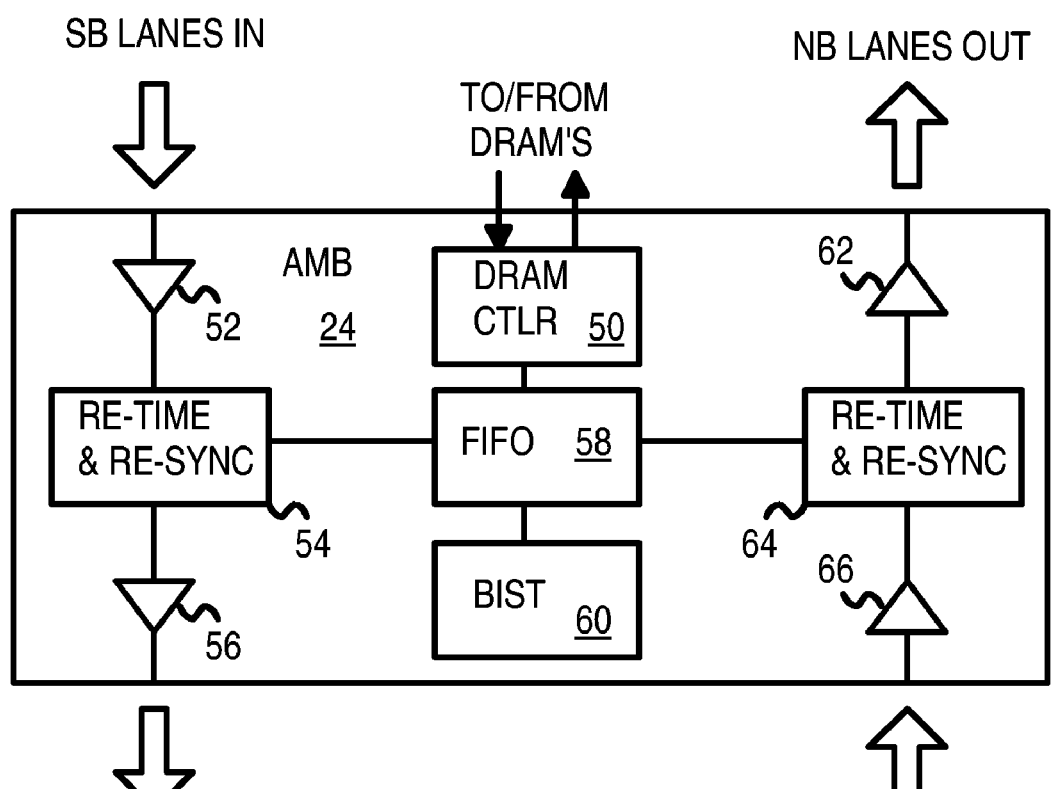
FIG. 2 shows detail of an advanced memory buffer on a fully-buffered memory module.
Figure 3:
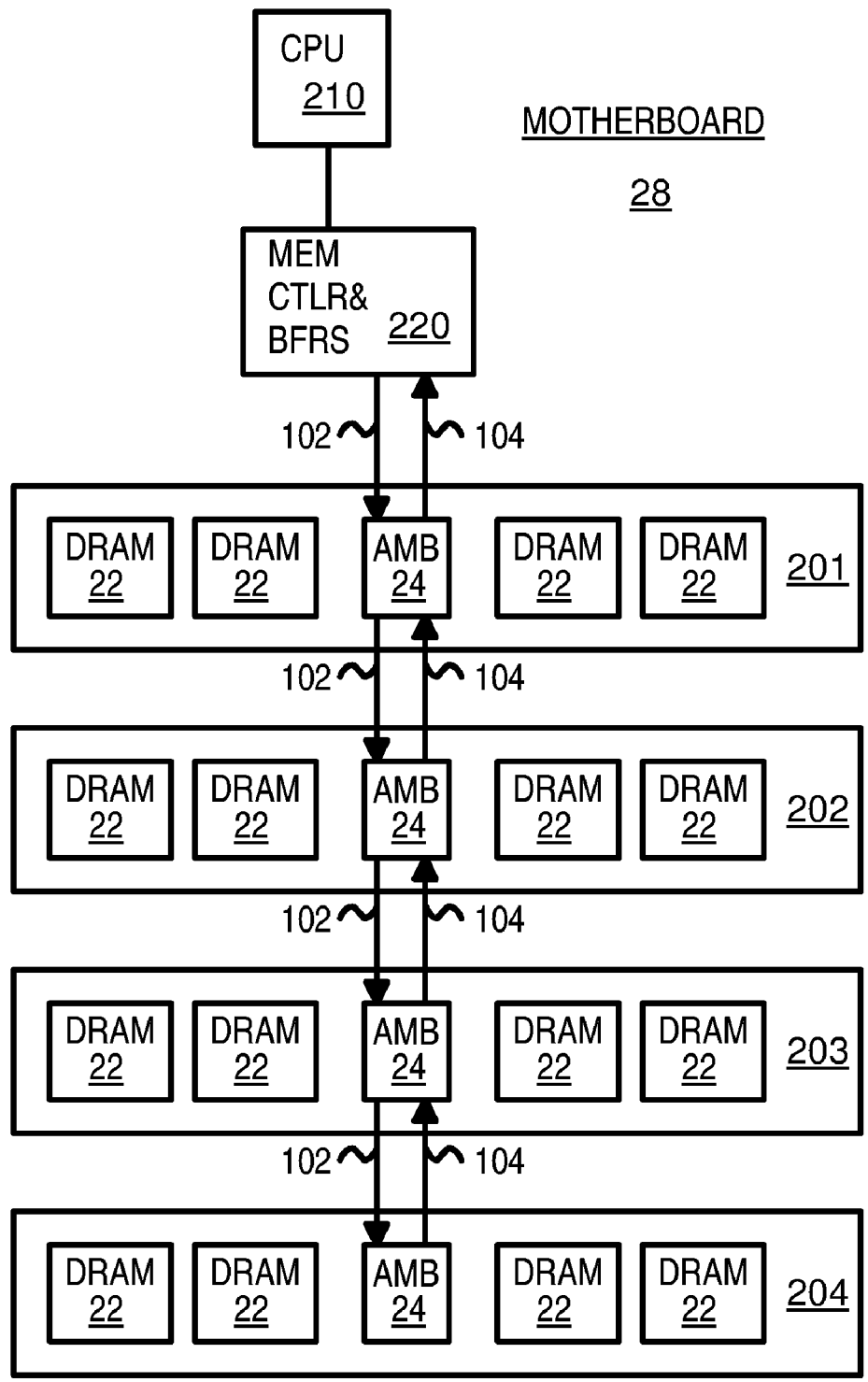
FIG. 3 shows fully-buffered memory modules daisy chained together.
Figure 4:
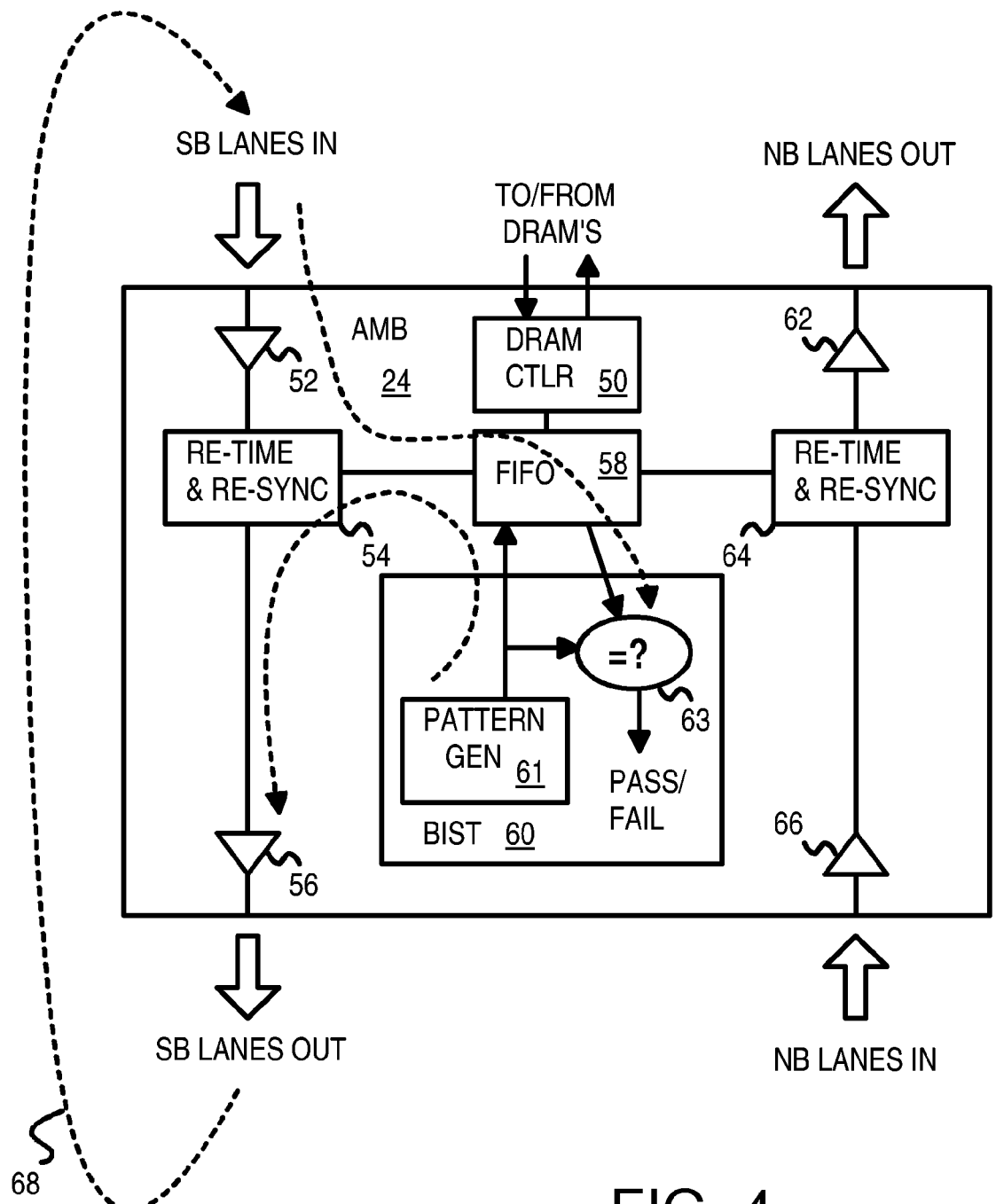
FIG. 4 shows external loop-back testing of a fully-buffered memory module.

During testing of fully-buffered memory modules, extender cards are inserted into the memory module sockets on a motherboard. The memory modules being tested are then inserted into the extender cards. However, the extender cards are not standard pass-though extender cards such as shown in FIGS. 5A–B. Instead, these extender cards provide external loopback wires (68 of FIG. 4) for supporting the loop-back test mode. Since the loopback wires are provided on the extender cards, the motherboard does not have to have the external loopback traces. Switches and muxes to support loopback testing are not needed on the motherboard.

Figure 6:
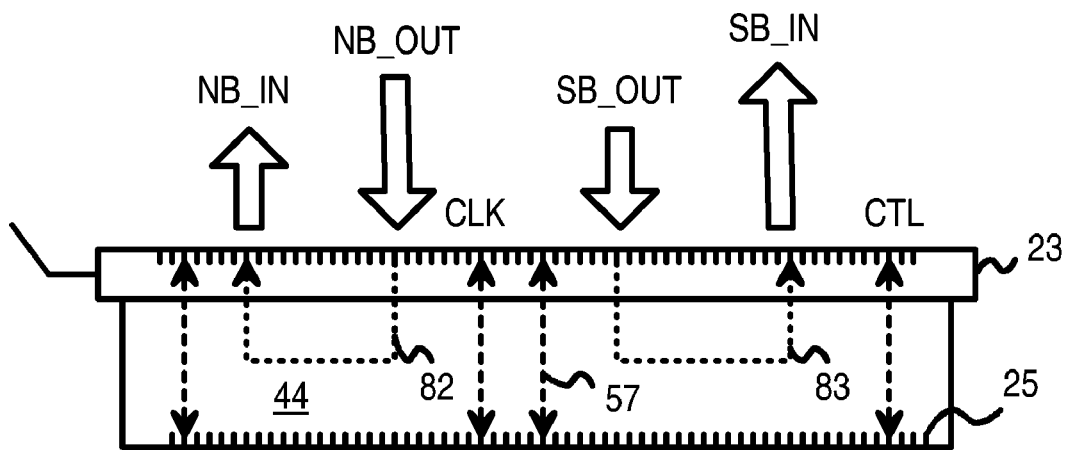
FIG. 6 shows a loop-back extender card for testing fully-buffered memory modules.

FIG. 6 shows a loop-back extender card for testing fully-buffered memory modules. Loop-back extender card 44 contains test socket 23 that has metal contacts that mate with metal contact pads 12 of memory module 10 when memory module 10 is inserted into test socket 23. Metal wiring traces on loop-back extender card 44 connect pass-through control signals 57 from test socket 23 to the corresponding signals on lower-edge contact pads 25. Pass-through control signals 57 may include clock signal CLK and test-mode control signal CTL for activating the various test modes of memory module 10. Power and ground are also passed through.

However, rather than pass northbound lanes and southbound lanes through from test socket 23 to lower-edge contact pads 25, loop-back extender card 44 disconnects northbound lanes between test socket 23 and lower-edge contact pads 25. Instead, northbound loopback 82 is formed from traces on loop-back extender card 44. Northbound loopback 82 connects northbound lane outputs of the AMB on the memory module inserted into test socket 23 to the northbound lane inputs of the same AMB on the memory module inserted into test socket 23.

Likewise, loop-back extender card 44 disconnects southbound lanes between test socket 23 and lower-edge contact pads 25. Southbound loopback 83 is formed from metal traces on loop-back extender card 44. Southbound loopback 83 connects southbound lane outputs of the AMB on the memory module inserted into test socket 23 to the southbound lane inputs of the same AMB on the memory module inserted into test socket 23.

Figure 7:
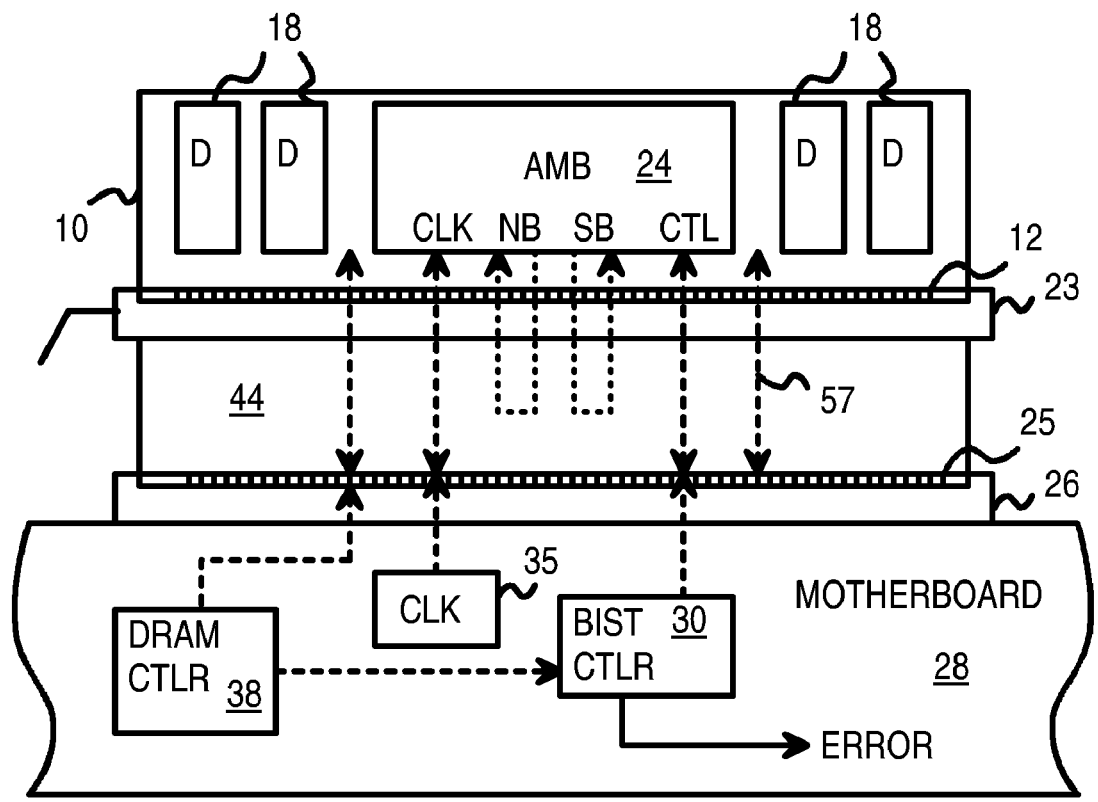
FIG. 7 show loop-back testing of a fully-buffered memory module using a loop-back extender card on a motherboard.

FIG. 7 show loop-back testing of a fully-buffered memory module using a loop-back extender card on a motherboard. Memory module 10 is inserted into test socket 23 on loop-back extender card 44, and lower-edge contact pads 25 on loop-back extender card 44 are inserted into memory module socket 26 on PC motherboard 28.

The increased height of test socket 23 above the surface of PC motherboard 28 makes testing easier since test socket 23 is more easily reached by an operator or handler machine.

During testing of memory module 10 inserted into test socket 23, DRAM controller 38 on PC motherboard 28 receives data from a CPU or bus master and generates control signals in pass-through control signals 57 that are passed through loop-back extender card 44 to memory module 10. Clock generator 35 generates a clock that is also passed through pass-through control signals 57 on loop-back extender card 44 to clock AMB 24 on memory module 10.

BIST controller 30 on motherboard 28 activates test modes of AMB 24 using pass-through control signals 57. Errors detected by the internal BIST circuitry in AMB 24 can be passed through loop-back extender card 44 to BIST controller 30 to signal an error to an operating system or boot routine running on motherboard 28.

Rather than pass frames from memory module to memory module, northbound lanes and southbound lanes from memory module 10 are disconnected by loop-back extender card 44 and do not reach motherboard 28. Instead, northbound loopback 82 on loop-back extender card 44 feeds northbound lane outputs of AMB 24 back to AMB 24 as northbound lane inputs. Also, southbound loopback 83 on loop-back extender card 44 feeds southbound lane outputs of AMB 24 back to AMB 24 as southbound lane inputs. The internal BIST controller of AMB 24 generates test patterns that are output on the northbound lane outputs, and compares the generated test patterns to data received on the northbound lane inputs. Data mismatches indicate a loop-back failure. Test patterns are likewise output on the southbound lane outputs and received data on southbound lane inputs is compared to detect southbound lane loopback errors.

A variety of specialized test patterns may be generated for loopback testing. Patterns such as walking-ones, walking-zeros, checkerboard, and inverse checkerboards may be used.

Figure 8:
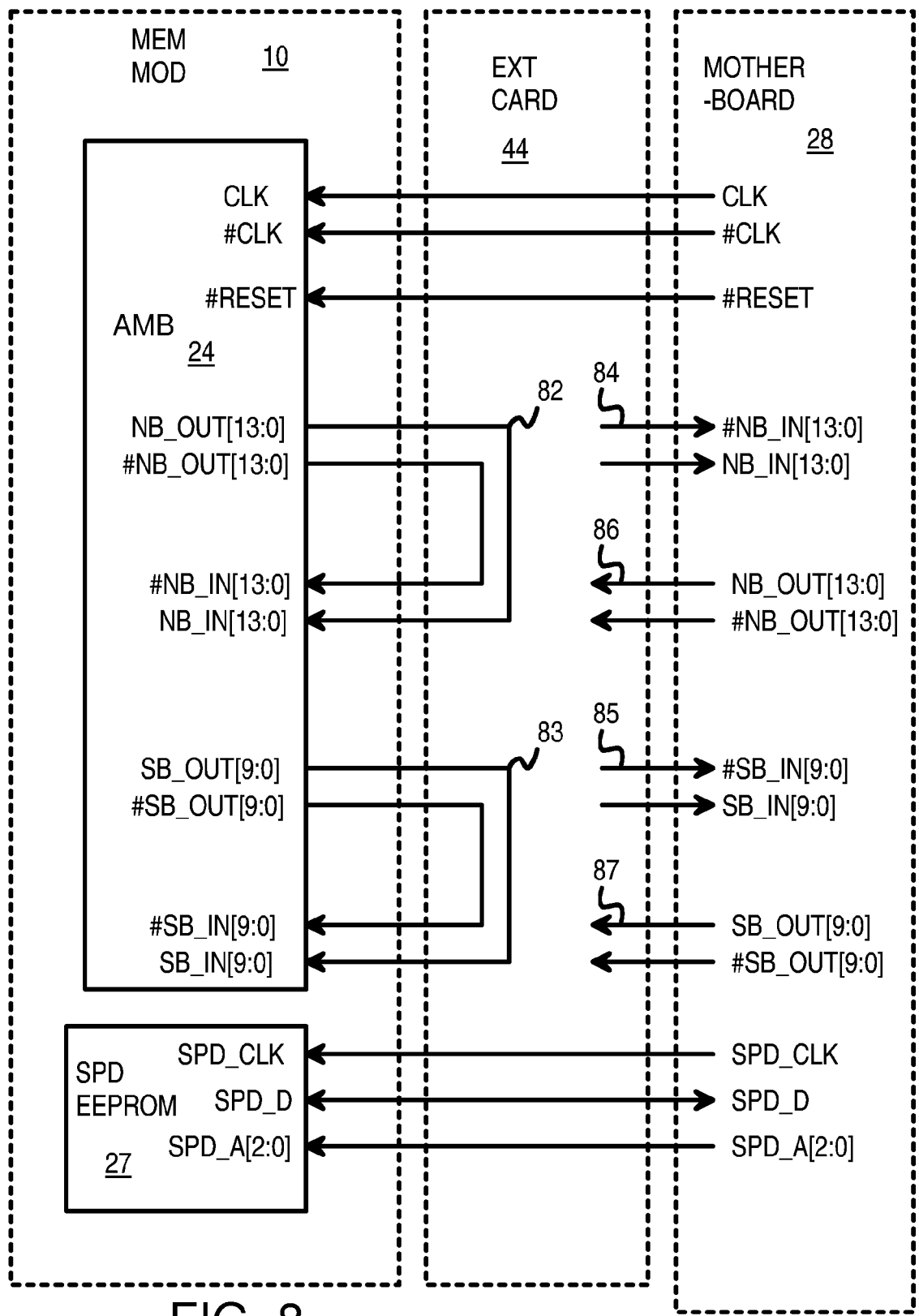
FIG. 8 is a diagram showing northbound and southbound lane loopback on a loop-back extender card between a memory module and a motherboard.

FIG. 8 is a diagram showing northbound and southbound lane loopback on a loop-back extender card between a memory module and a motherboard. Memory module 10 is a fully-buffered memory module that contains DRAM chips (not shown) that are buffered by AMB 24. Motherboard 28 contains a processor and other logic that generates pass-through control signals such as a differential clock, a reset signal, a system management bus or other control signals applied to serial-presence-detect (SPD) EEPROM 27 and test-mode control lines CTL of AMB 24.

SPD EEPROM 27 stores configuration information about memory module 10 that is sent over serial data line SPD_D synchronized to SPD clock SPD_CLK. Address inputs to SPD EEPROM 27 are carried from motherboard 28 on address lines SPD_A[2:0], which may be hard wired on motherboard 28. The wiring configuration of SPD_A[2:0] on motherboard 28 determines the device address (memory-module slot number) of memory module 10. Data sent over serial data line SPD_D is a series of frames consisting of device address, device type (AMB 24 or SPD EEPROM 27), register location, and register data. Test mode is activated on AMB 24 by writing to the AMB test-mode control registers. AMB 24 and SPD EEPROM 27 can share clock, address, and serial data lines, but respond to different device types at the same device address.

Northbound lane inputs NB_IN[13:0], #NB_IN[13:0] to AMB 24 are normally connected to northbound lane motherboard outputs 86, NB_OUT[13:0], #NB_OUT[13:0] on motherboard 28. These 14 northbound lanes carry frames generated by downstream memory modules that are being sent to the processor, perhaps through upstream memory modules (not shown).

Northbound lane outputs NB_OUT[13:0], #NB_OUT[13:0] from AMB 24 are normally connected to northbound lane motherboard inputs 84 (NB_IN[13:0], #NB_IN[13:0]) on motherboard 28. These 14 northbound lanes carry frames generated by memory module 10 or generated by downstream memory modules that are being sent to the processor. Northbound lane inputs NB_IN[13:0], #NB_IN[13:0] on motherboard 28 could connect to the memory controller and to the processor directly, or could connect to an upstream memory module (not shown).

However, loop-back extender card 44 breaks these northbound-lane connections between AMB 24 on memory module 10 and motherboard 28. Instead, northbound loopback 82 connects northbound lane outputs NB_OUT[13:0], #NB_OUT[13:0] that are output by AMB 24 back to northbound lane inputs NB_IN[13:0], #NB_IN[13:0] that are inputs to AMB 24. During loop-back test mode, AMB 24 generates test patterns that are output on northbound lane outputs NB_OUT[13:0], #NB_OUT[13:0], and compares the inputs on northbound lane inputs NB_IN[13:0], #NB_IN[13:0] to these generated test patterns. If a break or short occurred on loop-back extender card 44 in northbound loopback 82, or in the northbound-lane traces on memory module 10, or in the internal northbound-lane circuitry on AMB 24, these test patterns would mis-match, and a loopback error would be signaled.

Northbound lane motherboard outputs 86 and northbound lane motherboard inputs 84 are not connected on loop-back extender card 44 and can be left as opens. Alternately, northbound lane motherboard outputs 86 could be terminated and northbound lane motherboard inputs 84 could be connected to ground or a constant voltage such as the power supply.

Southbound lane inputs SB_IN[9:0], #SB_IN[9:0] to AMB 24 are normally connected to southbound lane motherboard outputs 87, SB_OUT[9:0], #SB_OUT[9:0] on motherboard 28. These 10 southbound lanes carry frames generated by the processor that are being sent to memory module 10 or to downstream memory modules in the daisy chain.

Southbound lane outputs SB_OUT[9:0], #SB_OUT[9:0] from AMB 24 are normally connected to southbound lane motherboard inputs 85 (SB_IN[9:0], #SB_IN[9:0]) on motherboard 28. These 10 southbound lanes carry frames generated by the processor that are being sent to downstream memory modules. Southbound lane outputs SB_OUT[9:0], #SB_OUT[9:0] on motherboard 28 could be driven by the memory controller directly, or could connect to an upstream memory module (not shown).

However, loop-back extender card 44 breaks these southbound-lane connections between AMB 24 on memory module 10 and motherboard 28. Instead, southbound loopback 83 connects southbound lane outputs SB_OUT[9:0], #SB_OUT[9:0] that are output by AMB 24 back to southbound lane inputs SB_IN[9:0], #SB_IN[9:0] that are inputs to AMB 24. During loop-back test mode, AMB 24 generates test patterns that are output on southbound lane outputs SB_OUT[9:0], #SB_OUT[9:0], and compares the inputs on southbound lane inputs SB_IN[9:0], #SB_IN[9:0] to these generated test patterns. If a break or short occurred on loop-back extender card 44 in southbound loopback 83, or in the southbound-lane traces on memory module 10, or in the internal southbound-lane circuitry on AMB 24, these test patterns would mis-match, and a loopback error would be signaled.

Southbound lane motherboard outputs 87 and southbound lane motherboard inputs 85 are not connected on loop-back extender card 44 and can be left as opens. Alternately, southbound lane motherboard outputs 87 could be terminated and southbound lane motherboard inputs 85 could be connected to ground or a constant voltage such as the power supply.

Figure 9:
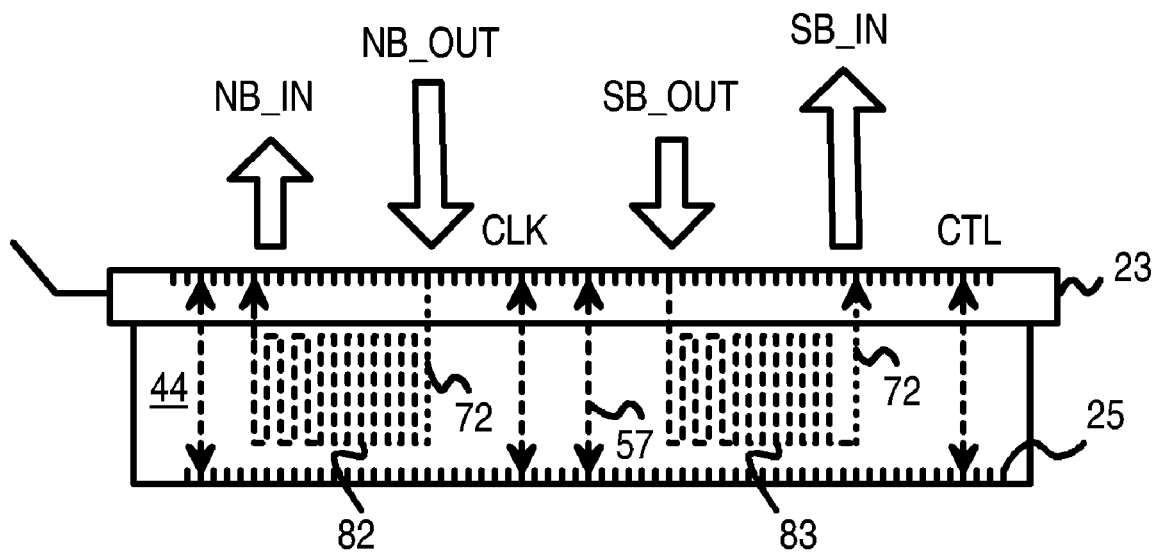
FIG. 9 shows a loop-back extender card with long traces for northbound and southbound lane loopback.

FIG. 9 shows a loop-back extender card with long traces for northbound and southbound lane loopback. Northbound loopback 82 is formed by serpentine traces 72. The length of northbound loopback 82 is significantly increased by winding the traces back and forth on loop-back extender card 44 through serpentine traces 72.

Likewise, Southbound loopback 83 is also formed by serpentine traces 72. The length of southbound loopback 83 is significantly increased by winding the traces back and forth on loop-back extender card 44 through serpentine traces 72.

Longer traces for northbound loopback 82 and southbound loopback 83 increase the capacitive and resistive loading on the northbound and southbound lane outputs of AMB 24. The differential drivers are driving a larger R-C load and thus are tested more fully. Serpentine traces 72 may be formed in the twisting, snake-like layout as shown, or on multiple layers of the PCB, or in a variety of patterns and layouts.

Figure 10:
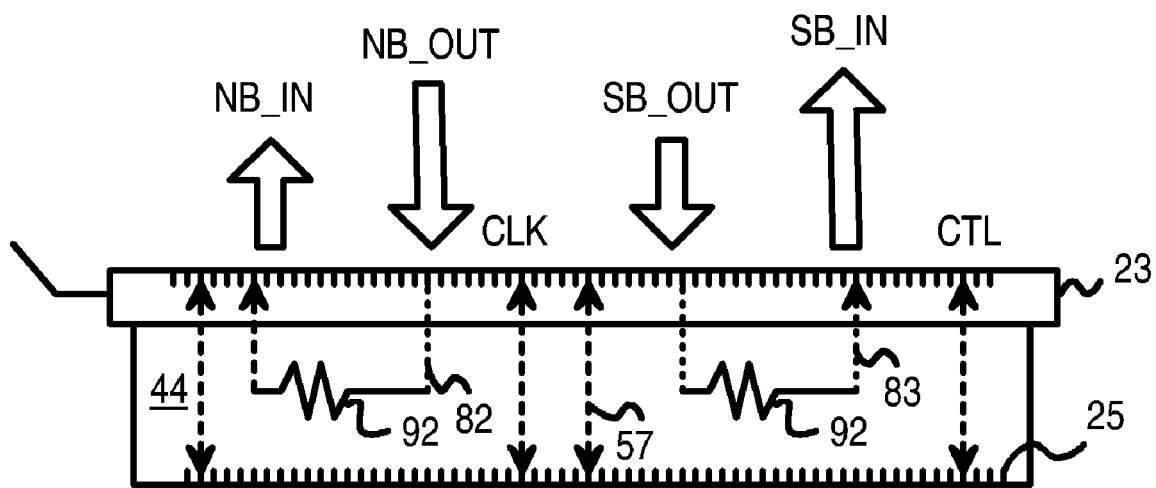
FIG. 10 highlights a loop-back extender card with resistive attenuation for northbound and southbound lane loopback.

FIG. 10 highlights a loop-back extender card with resistive attenuation for northbound and southbound lane loopback. Northbound loopback 82 contains series resistors 92 that are inserted in series between the northbound lane outputs and northbound lane inputs. A total of 28 resistors are needed for the 14 differential pairs.

Likewise, Southbound loopback 83 also contains series resistors 92 that are inserted in series between the southbound lane outputs and southbound lane inputs. A total of 20 resistors are needed for the 10 differential pairs.

Adding series resistors 92 to northbound loopback 82 and to southbound loopback 83 increases the R-C delay of the feedback path, delaying the arrival of the feedback signals to the inputs to AMB 24. The resistance value can be adjusted to adjust this delay to a desired value. Adding series resistors 92 can allow for margin testing to ensure that memory module 10 meets or exceeds delay specifications.

ALTERNATE EMBODIMENTS

Several other embodiments are contemplated by the inventors. For example the number of northbound and southbound lanes may vary. Different pass-through control signals may be included. A 2-layer printed-circuit board (PCB) or a PCB with more layers may be used for loop-back extender card 44.

Southbound or northbound loopback traces may be formed from metal traces on surfaces of loop-back extender card 44, or on interior traces on interior layers of a multi-layer PCB. Vias, wire jumpers, or other connections may form part of the electrical path of northbound loopback 82 or southbound loopback 83. The serpentine traces may each be more than double an average length of the pass-through control signal traces.

Series resistors 92 may be part of a larger resistor pack. The series resistor could have various values, such as 5 to 10 ohms. All series resistors could have the same value, or some series resistors could have different values. Capacitors or more complex filters could be added to loop-back extender card for loopback paths or for other paths. For example, power-to-ground bypass capacitors could be added to loop-back extender card 44.

Rather than using series resistors 92 in FIG. 10, a shunt resistor may be placed across each differential pair of the northbound and southbound loop-back paths 82 and 83. Whereas a series resistor alters both the amplitude and phase (delay) of the differential signal, a shunt resistor alters only the amplitude without significantly affecting the phase of the differential signal.

Signals may be half swing with source termination (output buffer) and load termination (input buffer). A series resistor or a shunt resistor in the path attenuates the signal. Shunt resistance may be around 500 ohms with a line impedance of 50 ohms.

Muxes and switches could be added to the extender cards to allow for loop-back testing as well as standard operation. The extender card could pass northbound and southbound lanes from memory module to the motherboard during normal modes, but loopback the northbound lane outputs to the northbound lane inputs during loopback test mode.

Future memory module standards and extensions of the fully-buffered DIMM standard could benefit from the invention. Testing of memory modules using motherboard testers may be enhanced by inserting loop-back extender card 44 into memory module sockets on the motherboard. Test socket 23 could be a standard memory module socket or could be a zero-insertion-force (ZIF) or other test socket for testing large numbers of memory modules.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A loop-back extender card comprising:
a substrate containing wiring traces for conducting signals;
first contact pads along a first edge of the substrate, the first contact pads for mating with a memory module socket on a motherboard;
a test socket, mounted to the substrate, for receiving a memory module during testing;
wherein the memory module contains memory chips and a buffer chip; wherein the buffer chip buffers data from the memory chips to the test socket and the memory chips do not directly drive data to the test socket;
northbound-lane module inputs, on the test socket, for connecting to northbound-lane inputs of the buffer chip on the memory module, the northbound-lane module inputs being differential inputs for carrying data buffered from memory chips of downstream memory modules;
northbound-lane module outputs, on the test socket, for connecting to northbound-lane outputs of the buffer chip on the memory module, the northbound-lane module outputs being differential outputs for carrying data buffered from the memory chips;
a northbound loopback, in the wiring traces, that connects the northbound-lane module outputs on the test socket to corresponding northbound-lane module inputs on the test socket,
northbound-lane motherboard inputs, on the first contact pads, that are disconnected from the test socket; and
northbound-lane motherboard outputs, on the first contact pads, that are disconnected from the test socket,
whereby northbound lanes from the test socket are looped back and disconnected from northbound lanes on the motherboard.

2. The loop-back extender card of claim 1 further comprising:
southbound-lane module inputs, on the test socket, for connecting to southbound-lane inputs of the buffer chip on the memory module, the southbound-lane module inputs being differential inputs for carrying data from a processor on the motherboard to the memory chips or to the memory chips of downstream memory modules;
southbound-lane module outputs, on the test socket, for connecting to southbound-lane outputs of the buffer chip on the memory module, the southbound-lane module outputs being differential outputs for carrying data from the processor to the memory chips of downstream memory modules;
a southbound loopback, in the wiring traces, that connects the southbound-lane module outputs on the test socket to corresponding southbound-lane module inputs on the test socket,
southbound-lane motherboard inputs, on the first contact pads, that are disconnected from the test socket;
southbound-lane motherboard outputs, on the first contact pads, that are disconnected from the test socket,
whereby northbound lanes and southbound lanes are separately looped back to the test socket by the loop-back extender card.

3. The loop-back extender card of claim 2 further comprising:
pass-through control signal traces in the wiring traces, the pass-through control signal traces connecting control signals on the first contact pads to control signals in the test socket,
whereby pass-through control signals are passed through to the memory module.

4. The loop-back extender card of claim 3 wherein the control signals include a differential clock, a reset signal, and a control signal for activating a test mode of the buffer chip, the test mode for generating test signals on the northbound-lane module outputs.

5. The loop-back extender card of claim 4 wherein the control signals further comprise serial-presence-detect (SPD) signals that control a serial-presence-detect (SPD) electrically-erasable programmable read-only memory (EEPROM) on the memory module.

6. The loop-back extender card of claim 3 wherein the northbound loopback comprises:
a plurality of serpentine traces, in the wiring traces, the plurality of serpentine traces having lengths substantially longer than lengths of the pass-through control signal traces,
whereby serpentine traces form the northbound loopback.

7. The loop-back extender card of claim 6 wherein the serpentine traces are each more than double an average length of the pass-through control signal traces.

8. The loop-back extender card of claim 6 wherein the southbound loopback comprises:
 a second plurality of serpentine traces, in the wiring traces, the second plurality of serpentine traces having lengths substantially longer than lengths of the pass-through control signal traces,
 whereby serpentine traces form the southbound loopback.

9. The loop-back extender card of claim 3 wherein the northbound loopback further comprises:
 a plurality of series resistors, having a series resistor inserted into each of the plurality of wiring traces in the northbound loopback,
 wherein the southbound loopback further comprises:
 a plurality of series resistors, having a series resistor inserted into each of the plurality of wiring traces in the southbound loopback,
 whereby loopback series resistance is increased by the plurality of series resistors.

10. The loop-back extender card of claim 3 wherein the buffer chip is an Advanced Memory Buffer (AMB).

11. The loop-back extender card of claim 3 wherein the memory module is a fully-buffered memory module wherein memory chips on the memory module have data outputs that connect to the buffer chip and do not connect to an edge connector of the memory module that fits into the test socket.

12. The loop-back extender card of claim 3 wherein the northbound-lane module inputs are for receiving frames being sent toward a processor on the motherboard in a daisy chain of memory modules;
 wherein the southbound-lane module inputs are for receiving frames being sent from the processor on the motherboard in the daisy chain of memory modules.

13. The loop-back extender card of claim 3 wherein the northbound loopback comprises 14 differential pairs of wiring traces that carry 14 bits in parallel on 28 wiring traces and wherein the southbound loopback comprises 10 differential pairs of wiring traces that carry 10 bits in parallel on 20 wiring traces.

14. The loop-back extender card of claim 3 wherein the southbound loopback and the northbound loopback comprise differential pairs of wiring traces that carry multiple bits in parallel on wiring traces, further comprising:
 a first plurality of shunt resistors, having a shunt resistor inserted across each differential pair of wires in the plurality of wiring traces in the northbound loopback,
 wherein the southbound loopback further comprises:
 a second plurality of shunt resistors, having a shunt resistor inserted across each differential pair of wires in the plurality of wiring traces in the southbound loopback, whereby loopback shunt resistance is provided.

15. The loop-back extender card of claim 3 wherein the test socket is a zero-insertion-force (ZIF) test socket.

16. A motherboard-based memory-module tester comprising:
 a personal computer motherboard having a microprocessor for executing programs;
 a memory controller on the personal computer motherboard for generating frames for reading and writing user data to a memory module under test;
 a plurality of memory module sockets on the personal computer motherboard for receiving memory modules;
 wherein the memory modules each contain memory chips and a buffer chip;
 wherein the buffer chip buffers data from the memory chips into frames to the memory controller and the memory chips do not directly drive data to the memory controller unless packaged into a frame by the buffer chip;
 an extender card having lower contact pads for fitting into one of the plurality of memory module sockets;
 wherein the lower contact pads comprise differential lane contacts for connecting to the memory controller or to other memory module sockets in a daisy chain of memory module sockets, the differential lane contacts for passing frames to and from the buffer chip;
 a test socket on the extender card for receiving the memory module under test, the test socket comprising differential data input lines for connecting to data inputs of the buffer chip, and differential data output lines for connecting to data outputs of the buffer chip;
 wiring traces on the extender card for passing control signals through from the lower contact pads to the test socket, the control signals being generated by the personal computer motherboard;
 loopback wiring traces that connect the differential data output lines in the test socket to the differential data input lines of the test socket;
 wherein the differential lane contacts of the lower contact pads do not connect to the test socket,
 whereby the differential data output lines are looped back to the differential data output lines by the loopback wiring traces on the extender card.

17. The motherboard-based memory-module tester of claim 16 wherein the differential data output lines comprise northbound lanes for passing frames toward the memory controller in the daisy chain and southbound lanes for passing frames generated by the memory controller.

18. The motherboard-based memory-module tester of claim 16 wherein the memory chips are dynamic-random-access memory (DRAM) chips.

19. A test extender card for loopback testing of fully-buffered memory modules, the test extender card comprising:
 substrate means for supporting wiring trace means for conducting signals;
 first contact pads means, along a first edge of the substrate means, for mating with a memory module socket on a motherboard;
 test socket means, mounted to the substrate means, for receiving a memory module during testing;
 wherein the memory module comprises memory chips and buffer chip means for buffering data from the memory chips to the test socket means;
 wherein the memory chips do not directly drive data to the test socket means;
 northbound-lane module input means, on the test socket means, for connecting to northbound-lane inputs of the buffer chip means on the memory module, the northbound-lane input means having differential input means for carrying data buffered from memory chips of downstream memory modules;
 northbound-lane module output means, on the test socket means, for connecting to northbound-lane outputs of the buffer chip means on the memory module, the northbound-lane output means having differential outputs for carrying data buffered from the memory chips;
 northbound loopback means, in the wiring trace means, for connecting the northbound-lane module output means on the test socket means to corresponding northbound-lane module input means on the test socket means, northbound-lane motherboard inputs, on the first contact pads means, that are disconnected from the test socket means; and northbound-lane motherboard outputs, on the first contact pads means, that are disconnected from the test socket means, whereby northbound lanes from the test socket means are looped back and disconnected from northbound lanes on the motherboard.

20. The test extender card of claim 19 further comprising:

southbound-lane module input means, on the test socket means, for connecting to southbound-lane inputs of the buffer chip means on the memory module, the southbound-lane inputs being differential inputs for carrying data from a processor to the memory chips or to the memory chips of downstream memory modules;

southbound-lane module output means, on the test socket means, for connecting to southbound-lane outputs of the buffer chip means on the memory module, the southbound-lane outputs being differential outputs for carrying data from the processor to the memory chips of downstream memory modules;

southbound loopback means, in the wiring trace means, for connecting the southbound-lane module output means on the test socket means to corresponding southbound-lane module input means on the test socket means, southbound-lane motherboard inputs, on the first contact pads means, that are disconnected from the test socket means;

southbound-lane motherboard outputs, on the first contact pads means, that are disconnected from the test socket means, whereby northbound lanes and southbound lanes are separately looped back to the test socket means by the extender card.

\* \* \* \* \*